(12) United States Patent
Lin et al.

(10) Patent No.: US 8,044,449 B2
(45) Date of Patent: Oct. 25, 2011

(54) MEMORY DEVICE WITH A LENGTH-CONTROLLABLE CHANNEL

(75) Inventors: Shian-Jyh Lin, Taoyuan County (TW); Hung-Chang Liao, Taoyuan County (TW); Meng-Hung Chen, Taoyuan County (TW); Chung-Yuan Lee, Taoyuan County (TW); Pei-Ing Lee, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 201 days.

(21) Appl. No.: 12/183,021

(22) Filed: Jul. 30, 2008

(65) Prior Publication Data
US 2009/0166703 A1 Jul. 2, 2009

(30) Foreign Application Priority Data
Jan. 2, 2008 (TW) .............................. 97100046 A

(51) Int. Cl.
*H01L 29/76* (2006.01)
*H01L 29/94* (2006.01)

(52) U.S. Cl. ...................................... 257/301; 257/302
(58) Field of Classification Search .................. 257/301, 257/302, E27.084
See application file for complete search history.

(56) References Cited

U.S. PATENT DOCUMENTS

| 5,879,998 A * | 3/1999 | Krivokapic | 438/300 |
| 6,838,866 B2 * | 1/2005 | Tsai et al. | 324/71.5 |
| 2004/0256665 A1 * | 12/2004 | Birner et al. | 257/329 |

* cited by examiner

*Primary Examiner* — Hung Vu

(57) ABSTRACT

A memory device is provided. The memory device includes a substrate, a trench having an upper portion and a lower portion formed in the substrate, a trench capacitor formed in the lower portion of the trench, a collar dielectric layer formed on a sidewall of the trench capacitor and extending away from a top surface of the substrate, a first doping region formed on a side of the upper portion of the trench in the substrate for serving as source/drain, a conductive layer formed in the trench and electrically connected to the first doping region, a top dielectric layer formed on conductive layer, a gate formed on the top dielectric layer, an epitaxy layer formed on both sides of the gate and on the substrate and a second doping area formed on a top of the epitaxy layer for serving as source/drain.

4 Claims, 17 Drawing Sheets

MEMORY DEVICE WITH A LENGTH-CONTROLLABLE CHANNEL

CROSS REFERENCE TO RELATED APPLICATIONS

This Application claims priority of Taiwan Patent Application No. 97100046, filed on Jan. 2, 2008, the entirety of which is incorporated by reference herein.

BACKGROUND OF THE INVENTION

1. Field of the Invention

The invention relates to a memory device, and in particular, to a memory device with a length-controllable channel and a fabrication method thereof.

2. Description of the Related Art

A dynamic random access memory (DRAM) utilizes charging alternation of capacitors disposed in memory cells to store information. With continued DRAM miniaturization and fabrication thereof, a reduced substrate area of a memory cell is required to increase the density of memory cells in integrated circuits. However, having a sufficiently large surface area of an electrode plate of memory cells to store charges is still essential. Currently, for example, a trench capacitor with a trench-type capacitor storage area formed in the substrate can effectively reduce the occupied area of memory cells.

Specifically, a conventional vertical transistor associated with an underneath trench capacitor can provide a proper gate length and a low leakage current, so that a high bit line voltage and a small lateral area are achieved.

A conventional memory device structure is shown in FIG. 1. A memory device 1 comprises a substrate 2, a trench 3, a trench capacitor 4, a top dielectric layer 5, a gate oxide layer 6, a gate 7, a source S and a drain D.

The trench 3 is formed in the substrate 2. The trench capacitor 4 is formed in the lower portion of the trench 3. The top dielectric layer 5 is formed in the trench 3, leaving a long distance from the top dielectric layer 5 to the surface of the substrate 2. The gate 7 is formed on the top dielectric layer 5. The gate oxide layer 6 is formed between the gate 7 and the substrate 2. The source S and the drain D are formed on both sides of the trench 3 in the substrate 2.

BRIEF SUMMARY OF THE INVENTION

A feature of the invention provides a memory device comprising a substrate, a trench having an upper portion and a lower portion formed in the substrate, a trench capacitor formed in the lower portion of the trench, a collar dielectric layer formed on a sidewall of the trench capacitor and extending away from a top surface of the substrate, a first doping region formed on a side of the upper portion of the trench in the substrate for serving as source/drain, a conductive layer formed in the trench and electrically connected to the first doping region, a top dielectric layer formed on conductive layer, a gate formed on the top dielectric layer, an epitaxy layer formed on both sides of the gate and on the substrate and a second doping area formed on a top of the epitaxy layer for serving as source/drain. Whereby after formation of the epitaxy layer on the sides of the gate, a channel length is controlled.

Another feature of the invention provides a method for fabricating a memory device comprising providing a substrate, forming a trench having an upper portion and a lower portion in the substrate, forming a trench capacitor comprising an upper electrode in the lower portion of the trench, forming a collar dielectric layer to surround sidewalls of the trench above the trench capacitor, forming a conductive pillar in the trench to electrically connect to the upper electrode of the trench capacitor, forming a top dielectric layer on the top of the trench, forming an epitaxy layer on the substrate and forming a gate on the top dielectric layer.

The trench top oxide (TTO) (the top dielectric layer) is formed on the top of the trench, adjacent to the substrate surface. Compared to conventional TTO fabrication, the invention is simple due to the lower trench aspect ratio formation. Moreover, the usable surface area of the trench is enlarged due to displacement of the trench top oxide (TTO), improving storage efficiency of the capacitor.

Another feature of the invention, a channel of a vertical transistor is formed by growth of the epitaxy layer on the substrate. Compared to a conventional process whereby the channel is fabricated in a silicon substrate, a channel length is precisely controlled by adjustment of the growth rate and the processing time of the epitaxy layer in the invention. For example, the channel length can be precisely controlled to achieve a dimension lower than 100 nm.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawing, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is determined by reference to the appended claims.

Figure 1:
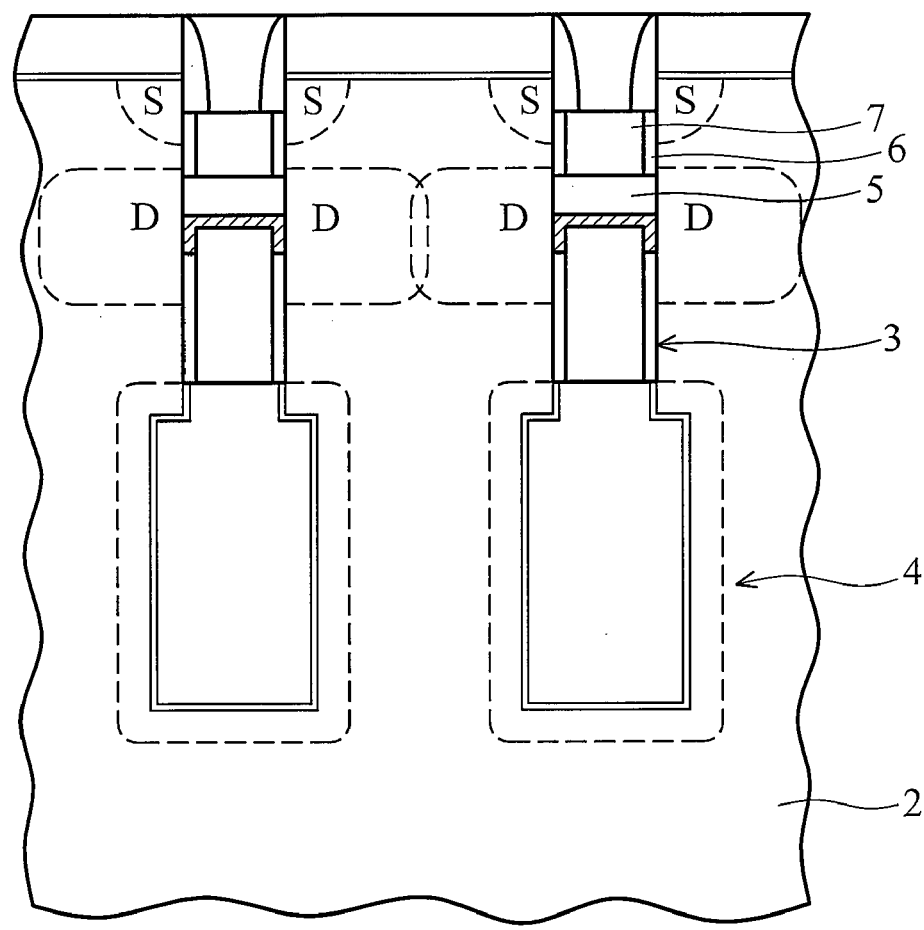
FIG. 1 is a cross sectional view of a conventional memory device.
Figure 2:
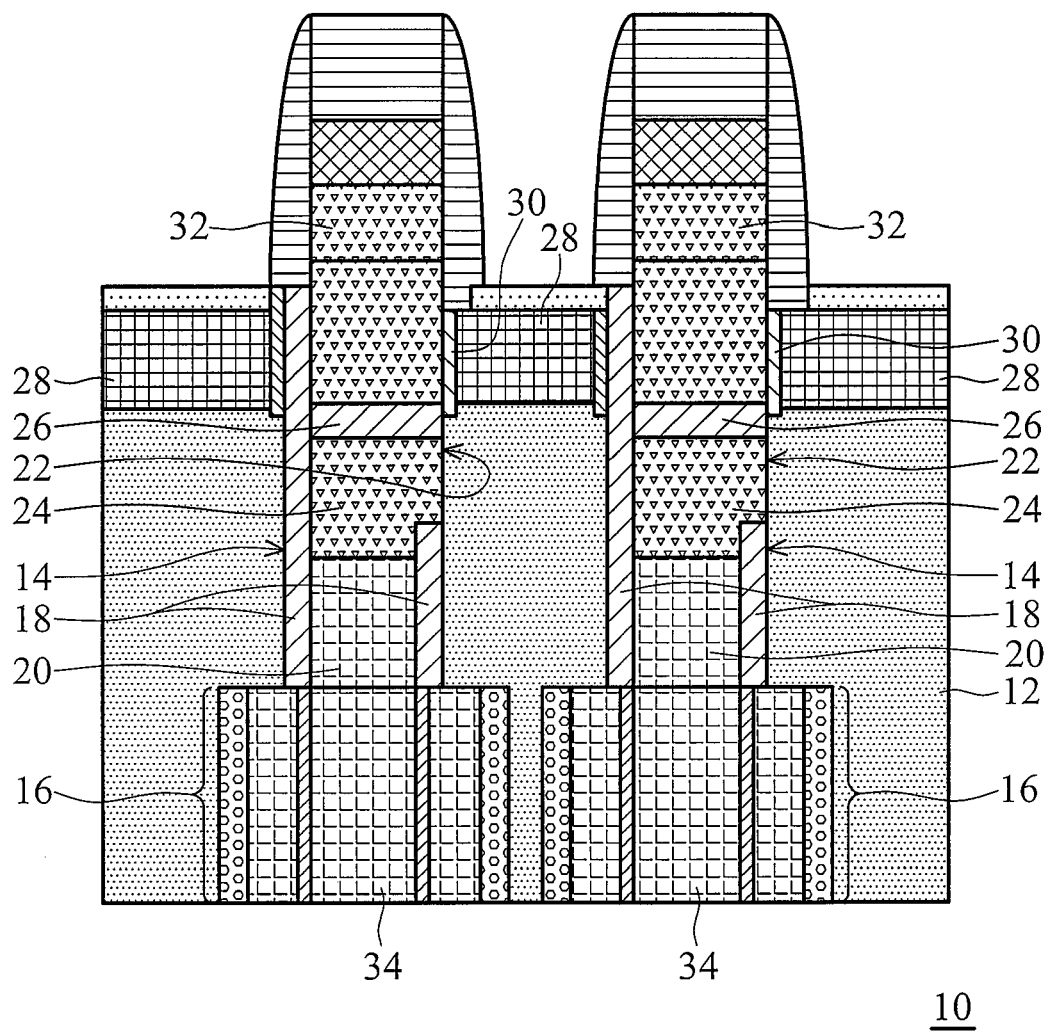
FIG. 2 is a cross sectional view of a memory device in an embodiment of the invention.

In an embodiment of the present invention, a memory device is disclosed in FIG. 2. A memory device 10 comprises a substrate 12, a trench 14 having an upper portion and a lower portion, a trench capacitor 16, a collar dielectric layer 18, a conductive pillar 20, a buried strap 22, a conductive layer 24, a top dielectric layer 26, an epitaxy layer 28, a gate oxide layer 30 and a gate 32.

The trench 14 is formed in the substrate 12. The trench capacitor 16 having an upper electrode 34, for example, a metal-insulator-silicon (MIS) capacitor, is formed in the lower portion of the trench 14. The collar dielectric layer 18 is formed and surrounded a sidewall of the trench 14 and extending away from a top surface of the substrate 12. The conductive pillar 20 is formed on the trench capacitor 16 in the trench 14 and electrically connected to the upper electrode 34 of the trench capacitor 16. The buried strap 22 is formed on one side of the upper portion of the trench 14. The conductive layer 24 is formed on the conductive pillar 20 in the trench 14 to electrically connect the buried strap 22 and the conductive pillar 20. The top dielectric layer 26 is formed on the conductive layer 24 in the upper portion of the trench 14. The gate 32 is formed on the top dielectric layer 26. The epitaxy layer 28 is formed on both sides of the gate 32 on the substrate 12. The gate oxide layer 30 is formed on the epitaxy layer 28 and located between the gate 32 and the epitaxy layer 28.

Figure 3A:
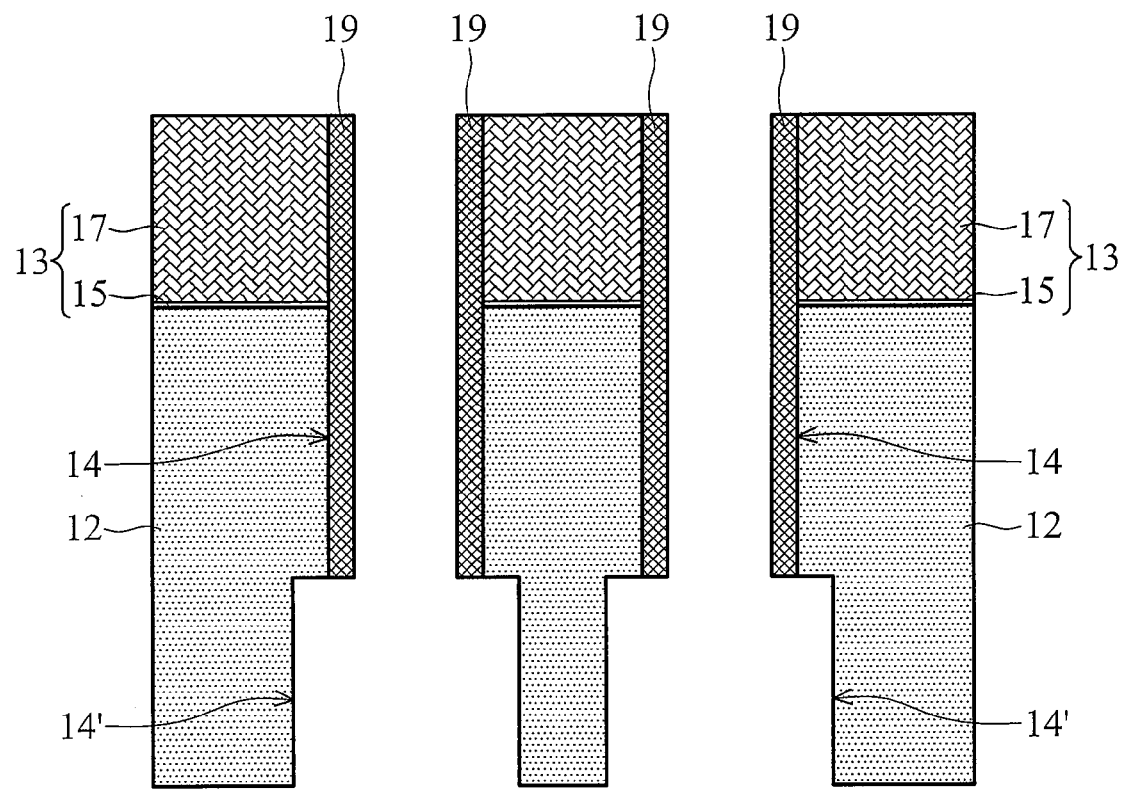
FIGS. 3A-3N are cross sectional views of a fabrication method for a memory device in an embodiment of the invention.
Figure 3B:
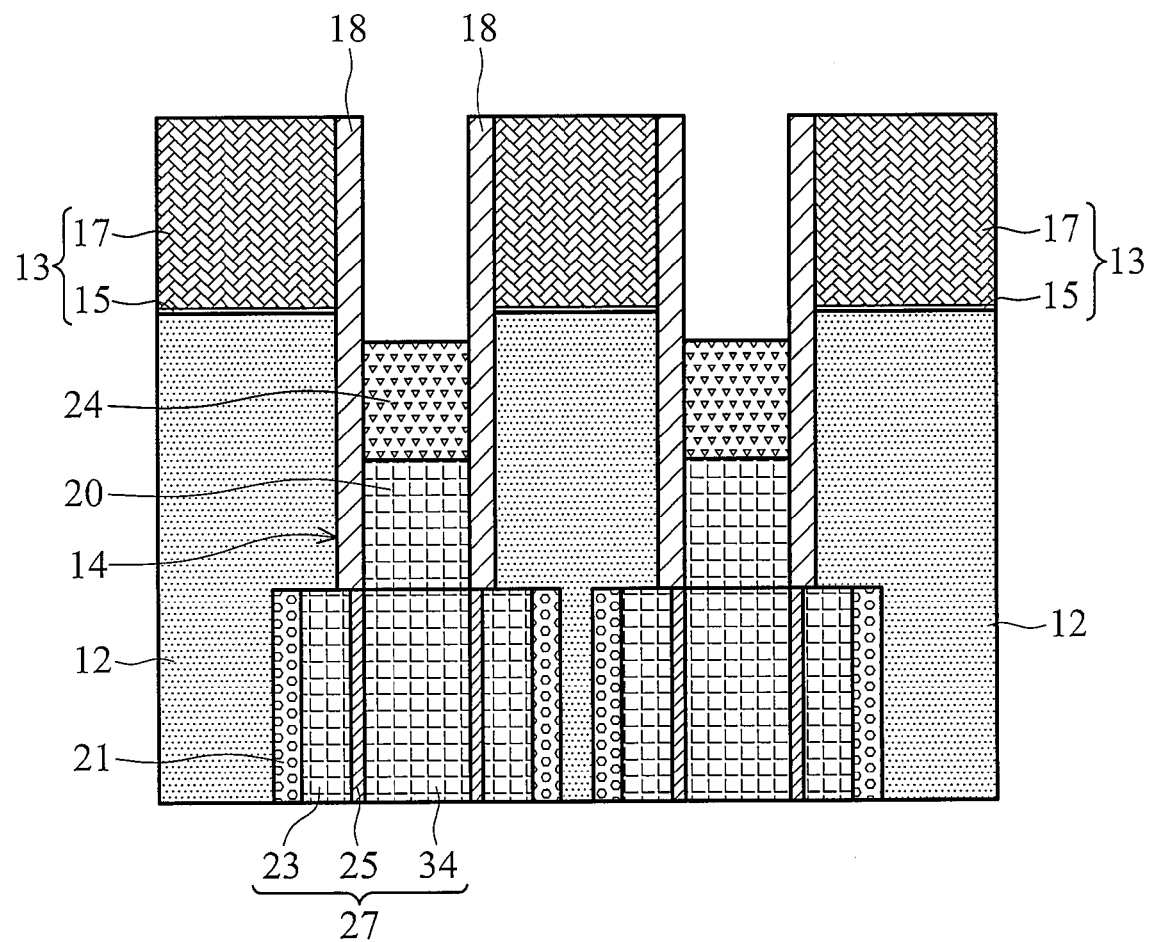
Figure 3C:
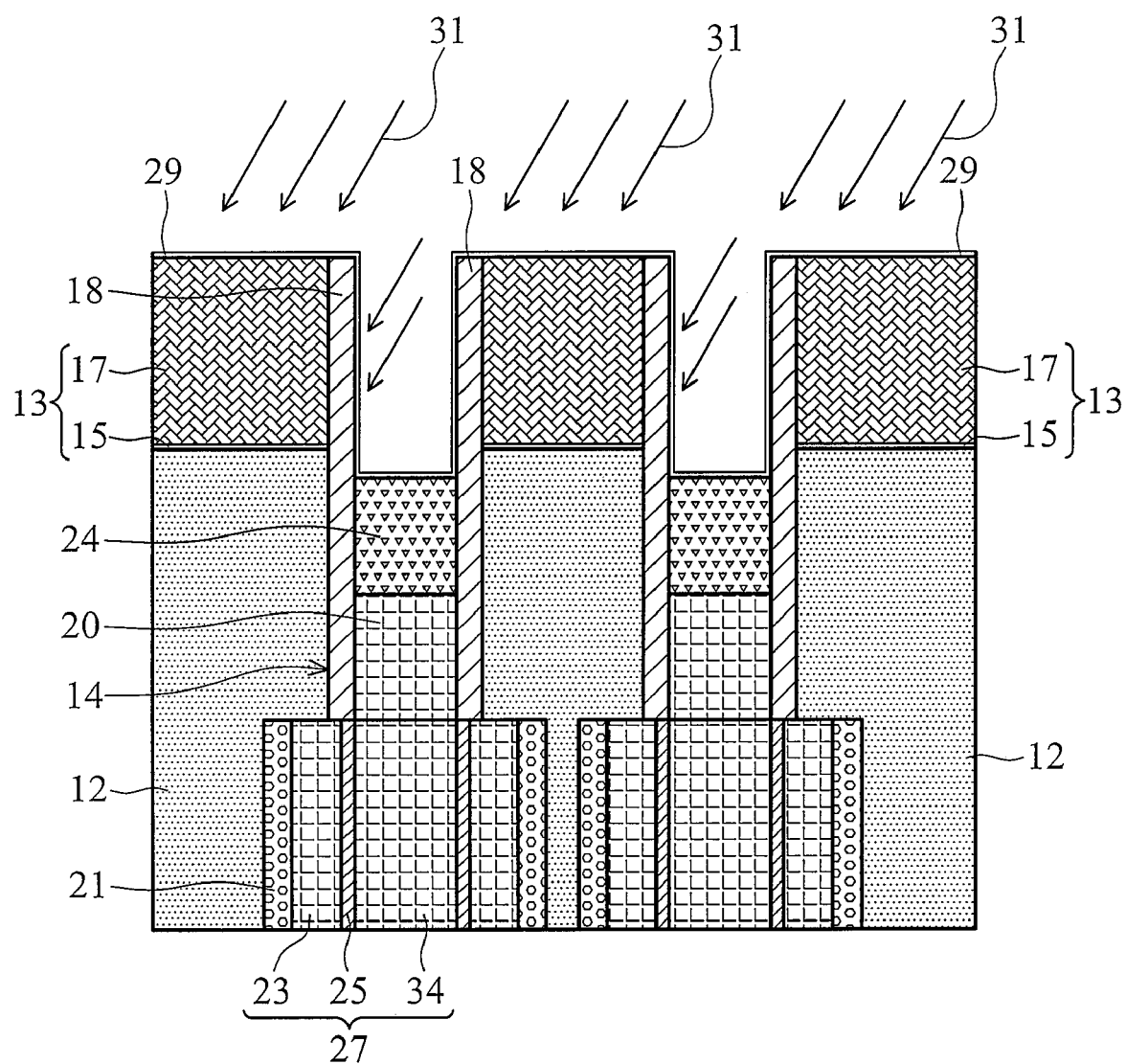
Figure 3D:
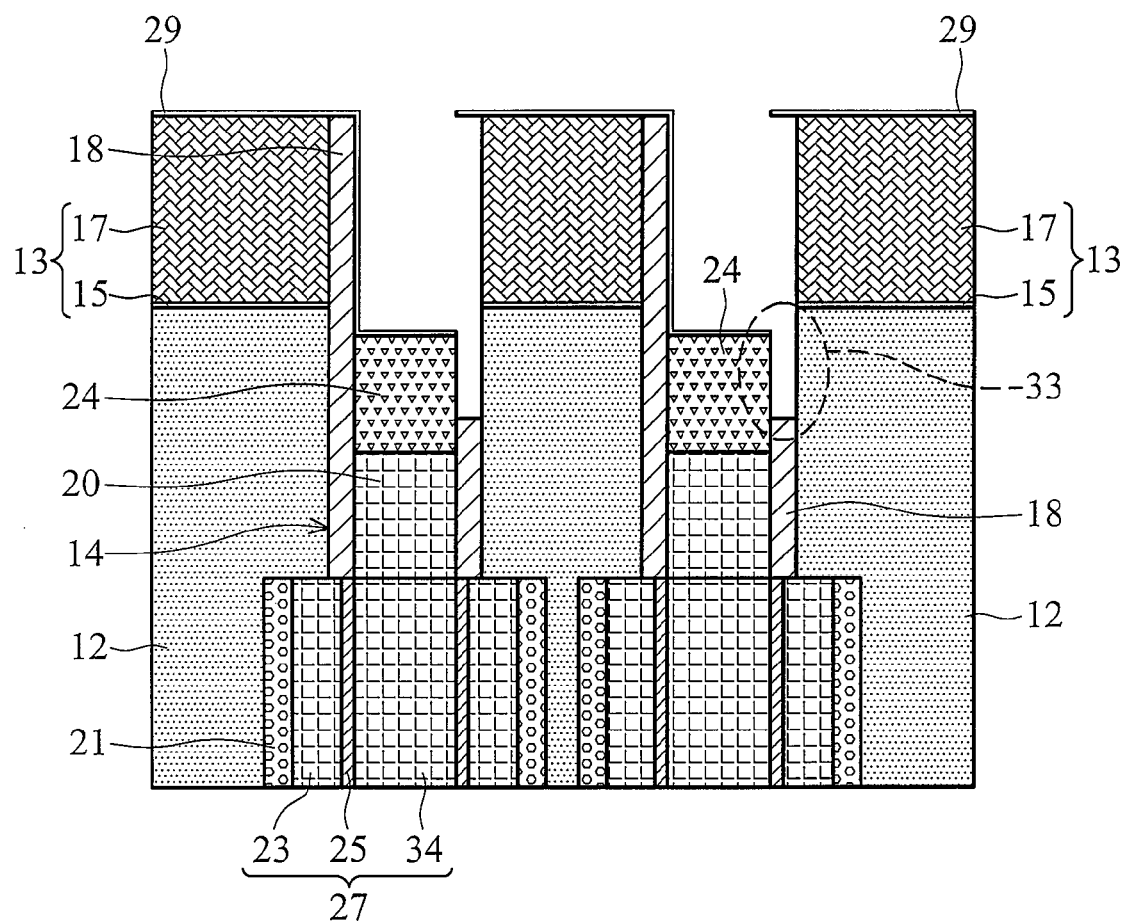
Figure 3E:
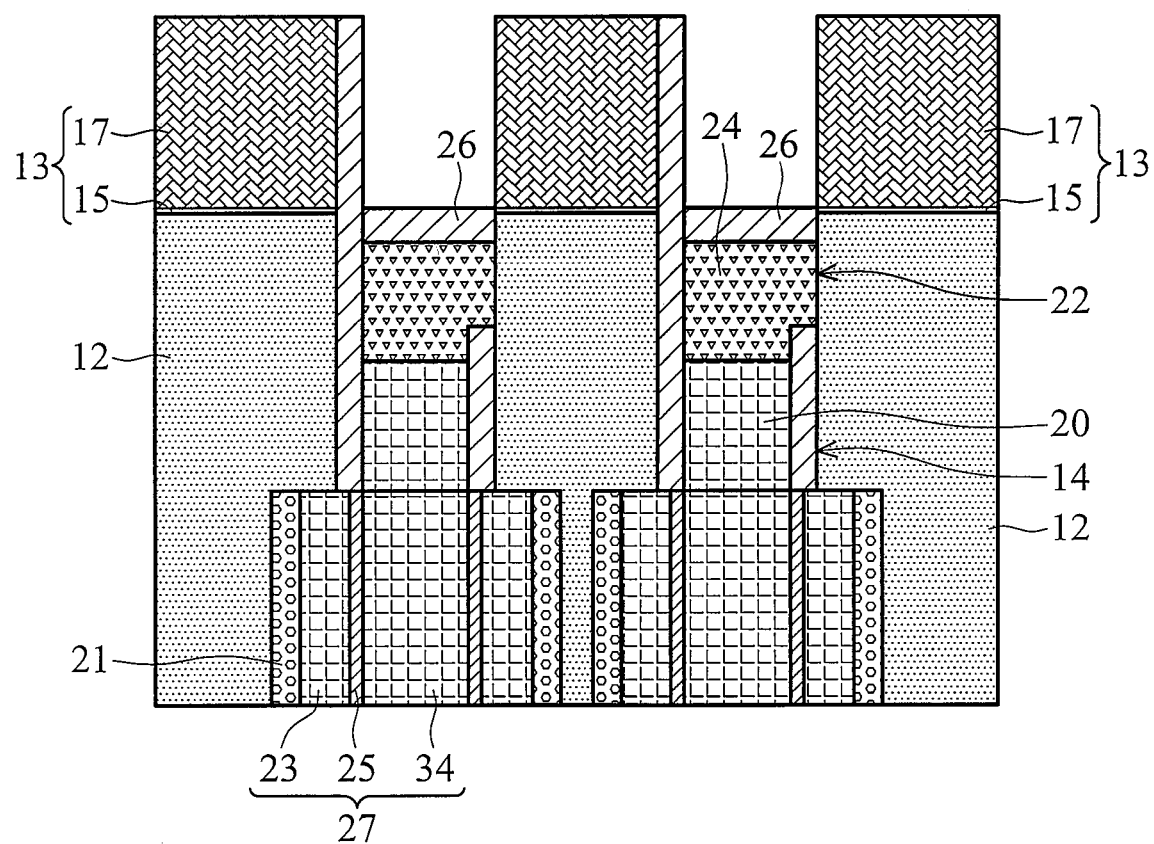
Figure 3F:
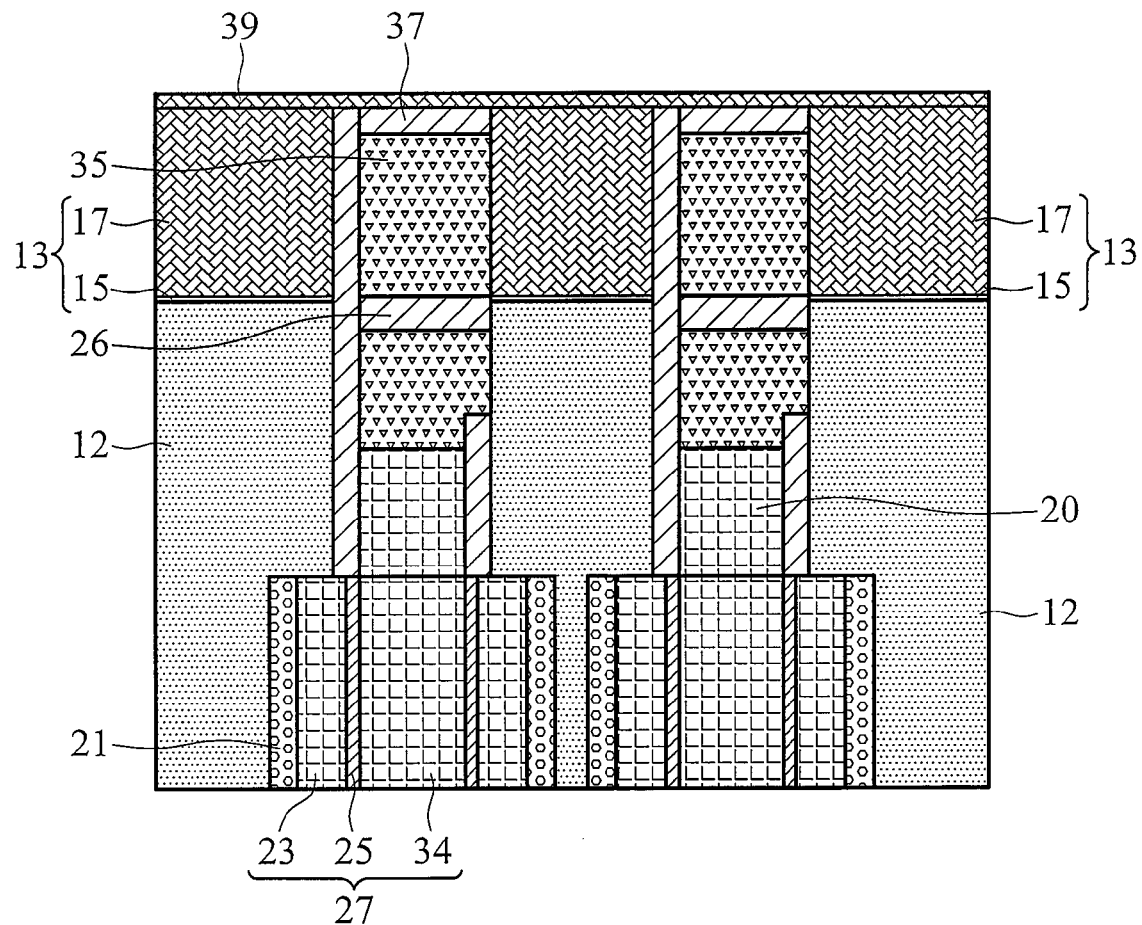
Figure 3G:
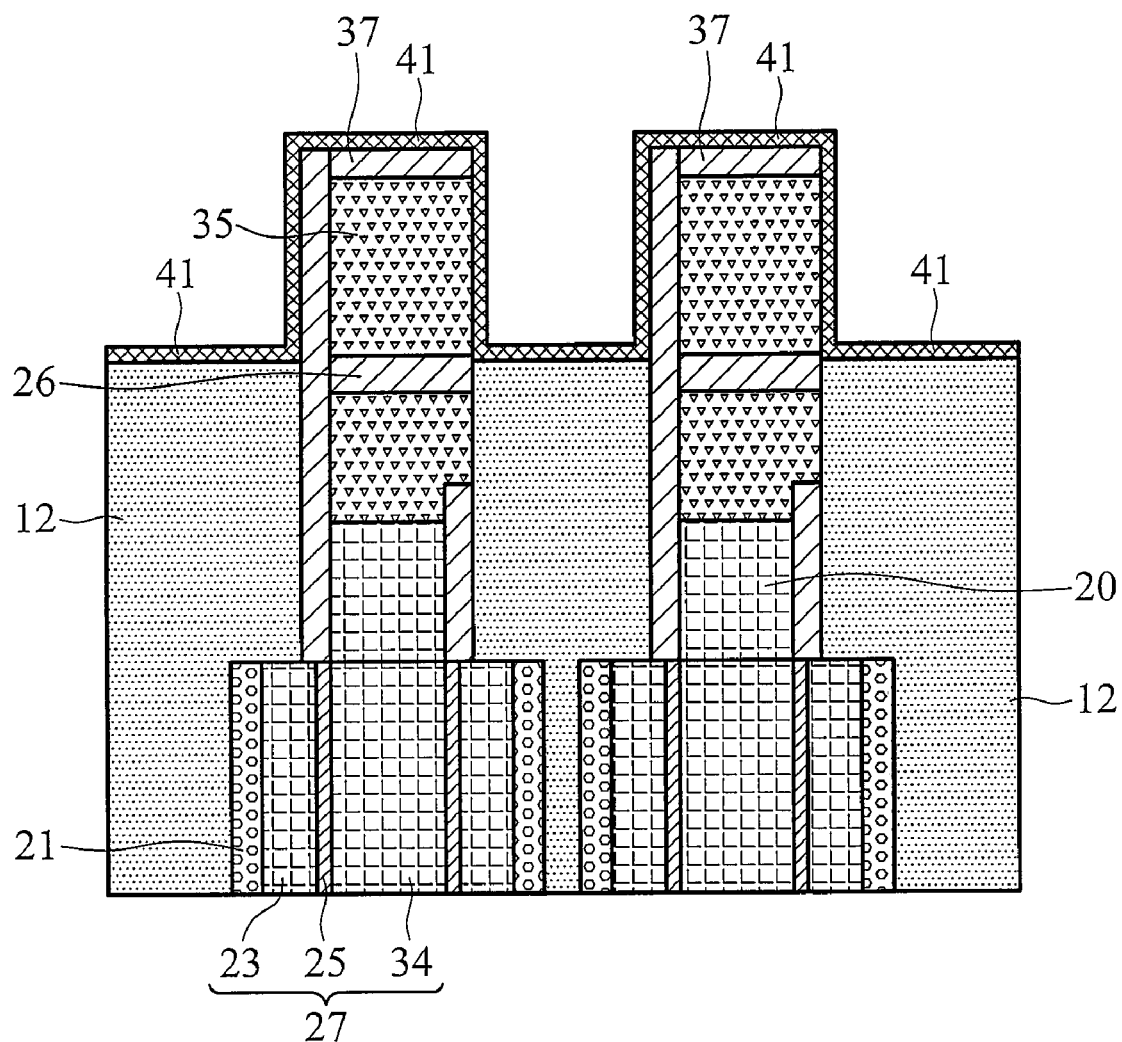
Figure 3H:
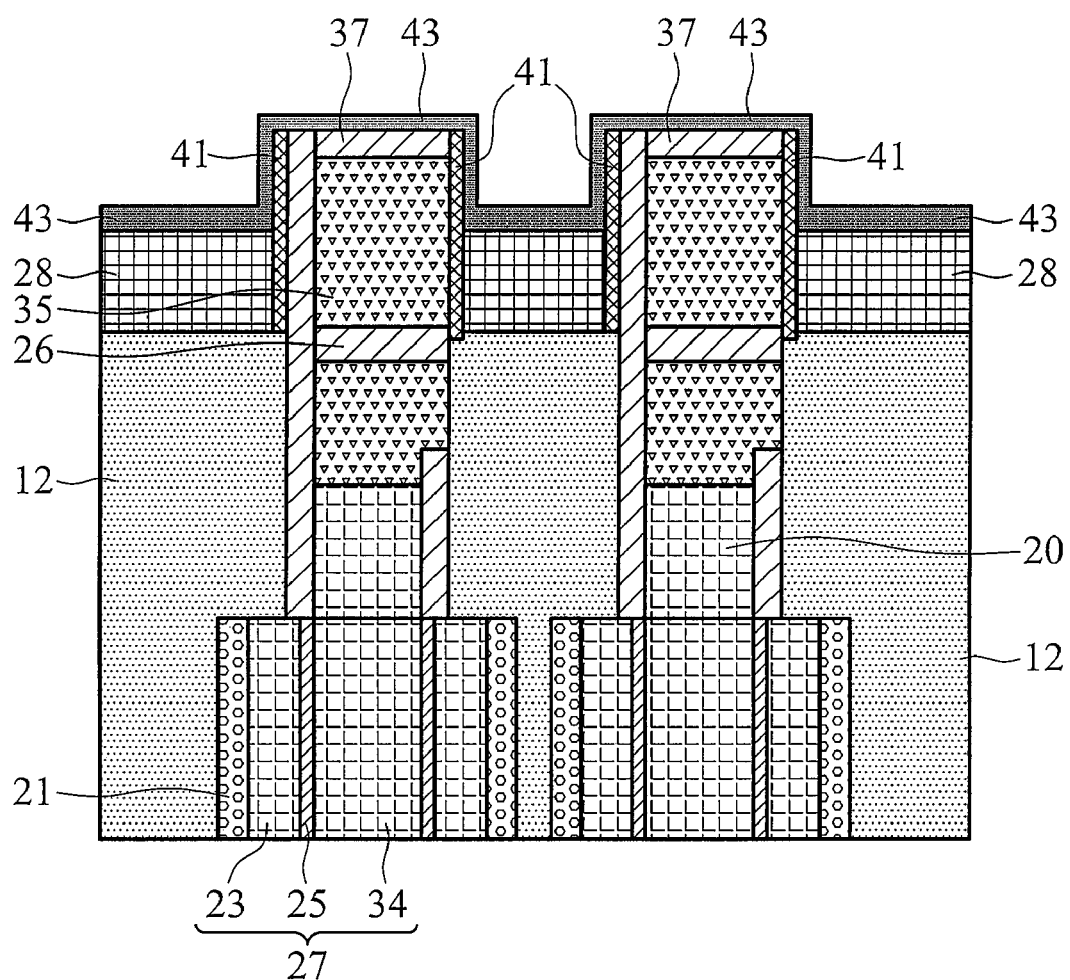
Figure 3I:
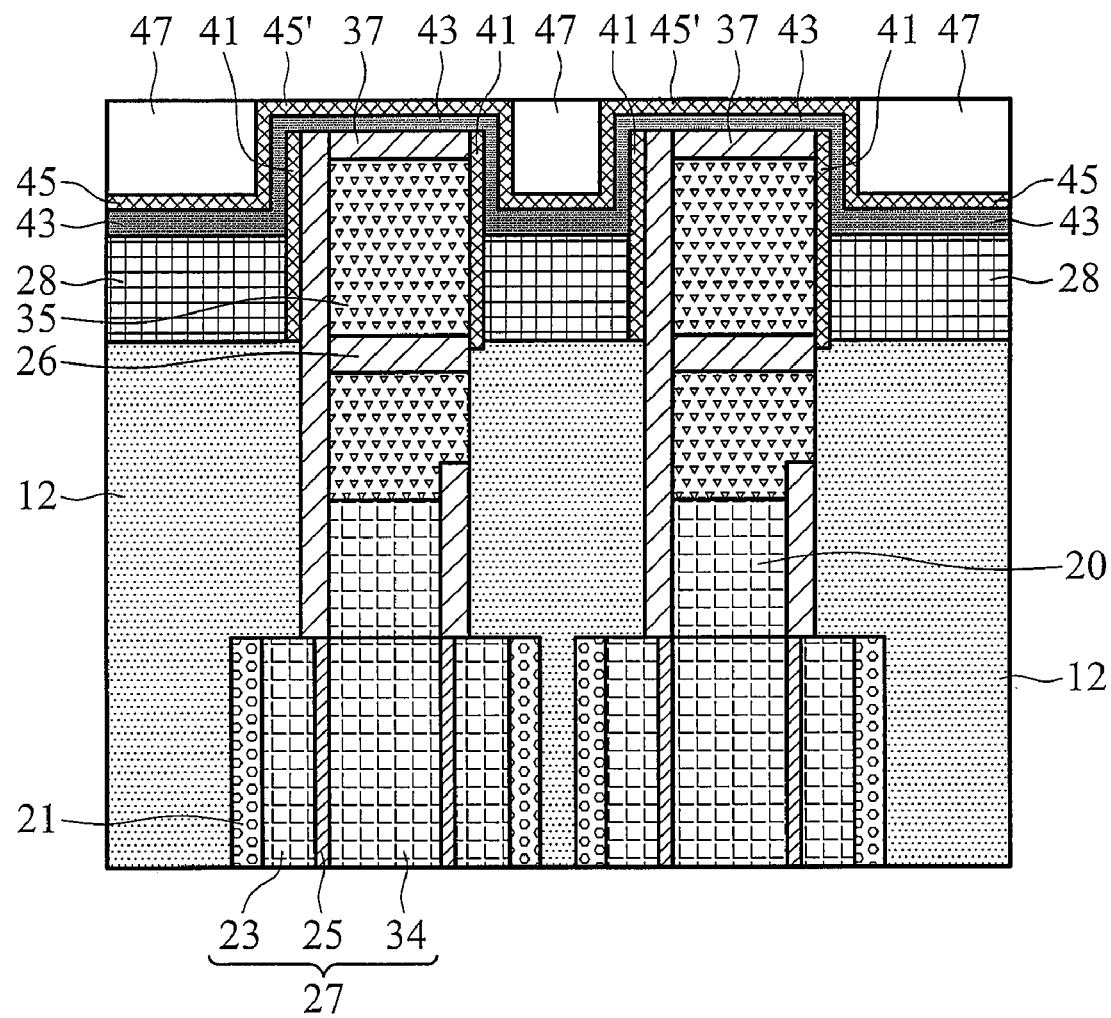
Figure 3J:
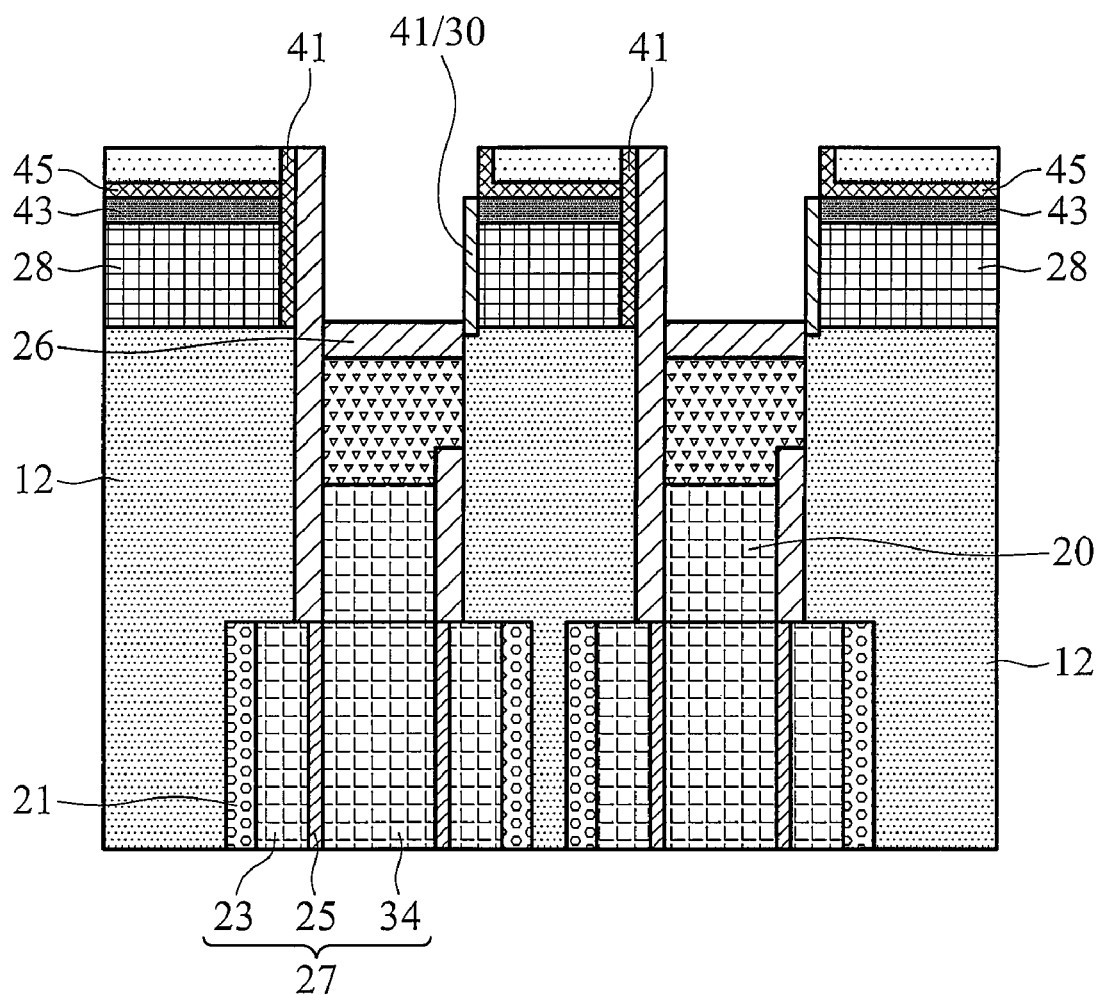
Figure 3K:
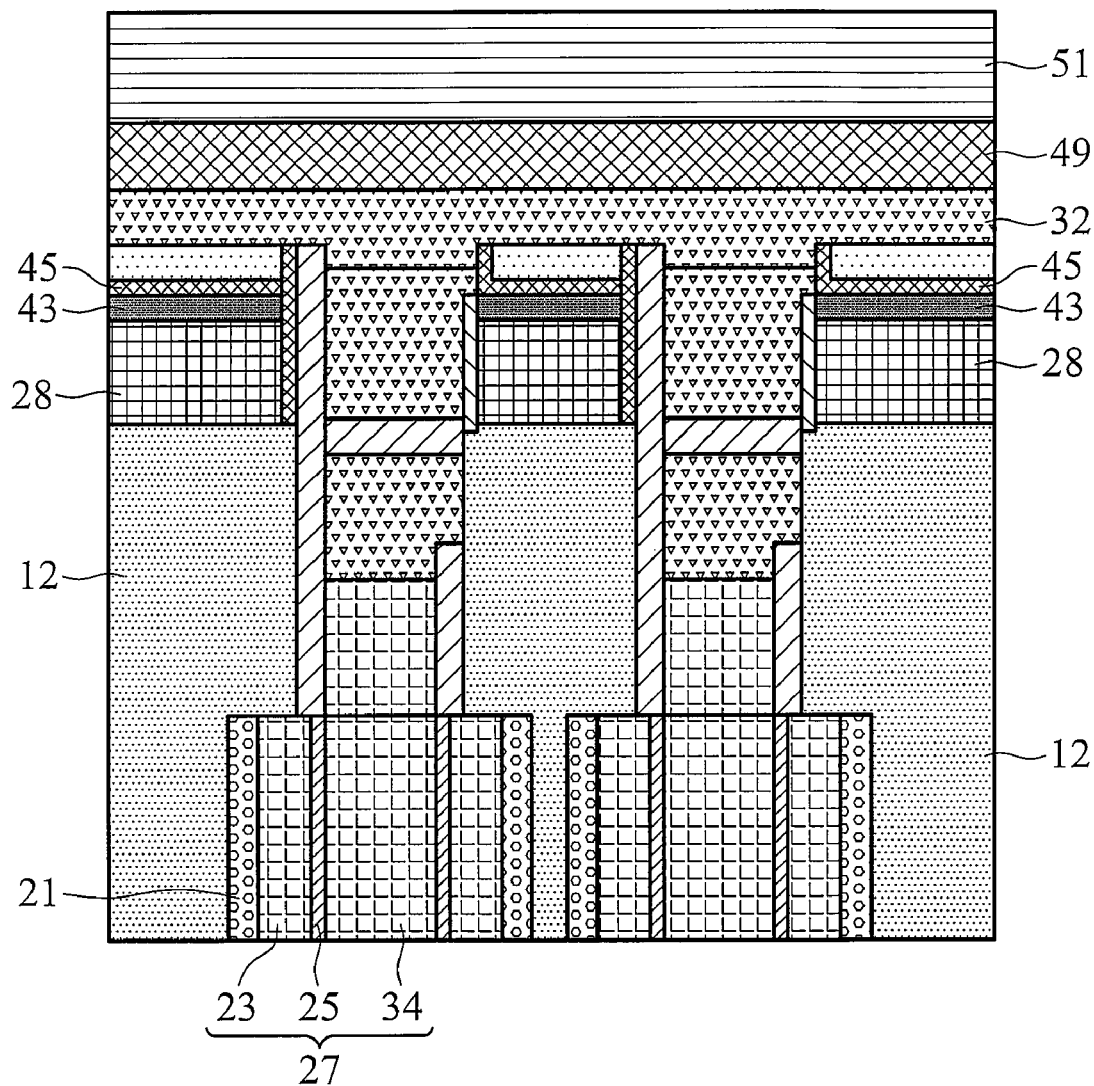
Figure 3L:
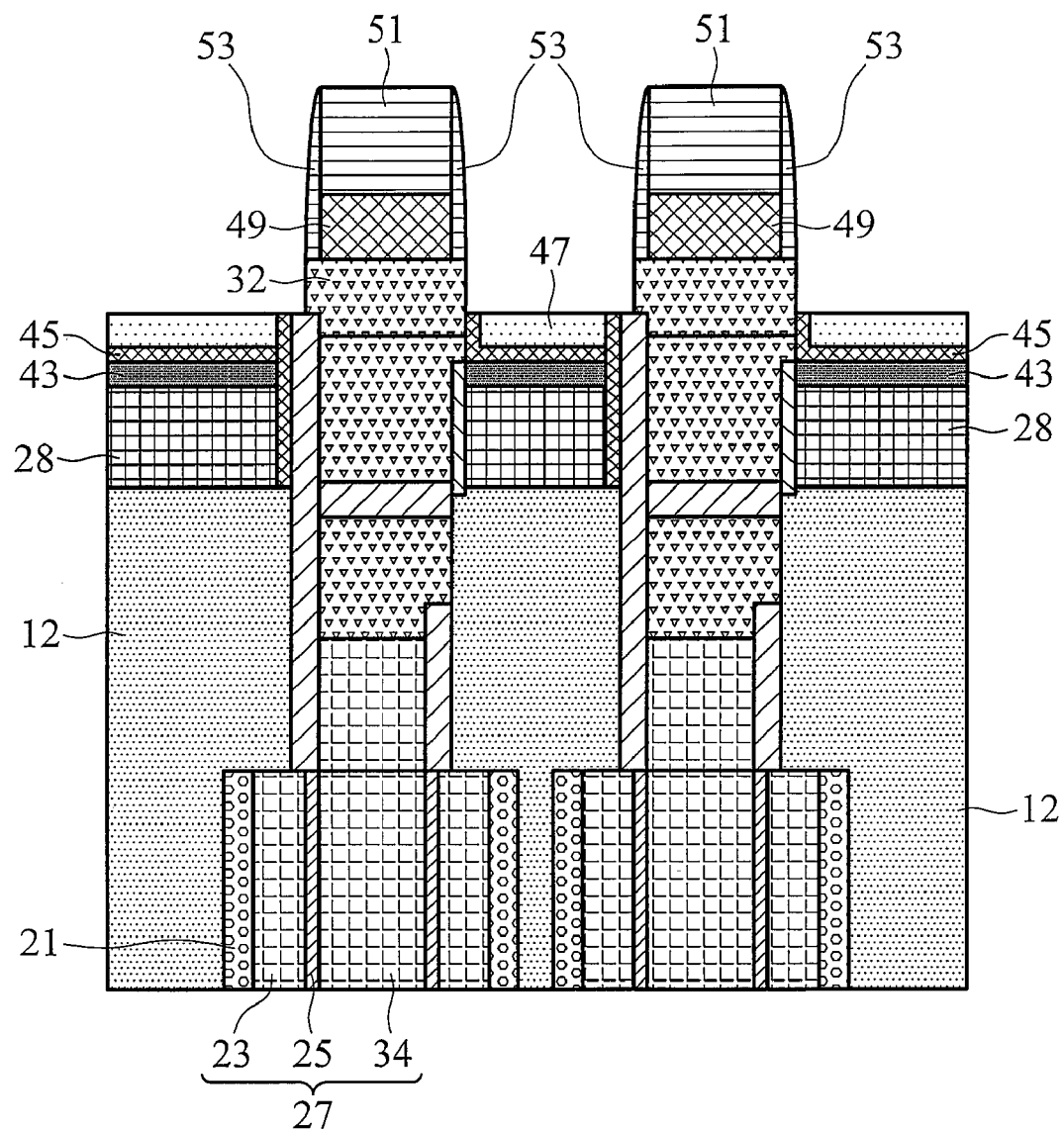
Figure 3M:
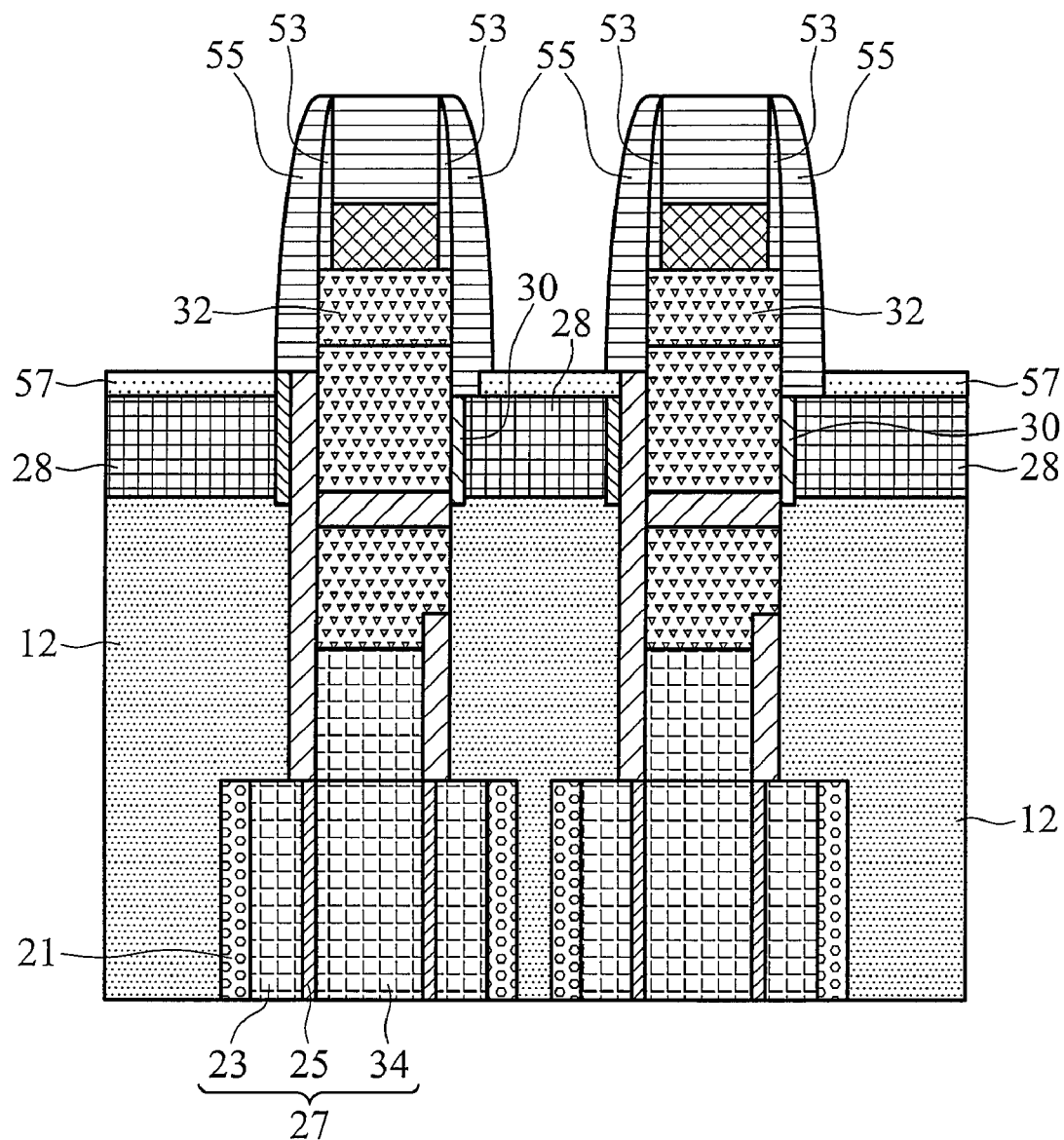
Figure 3N:
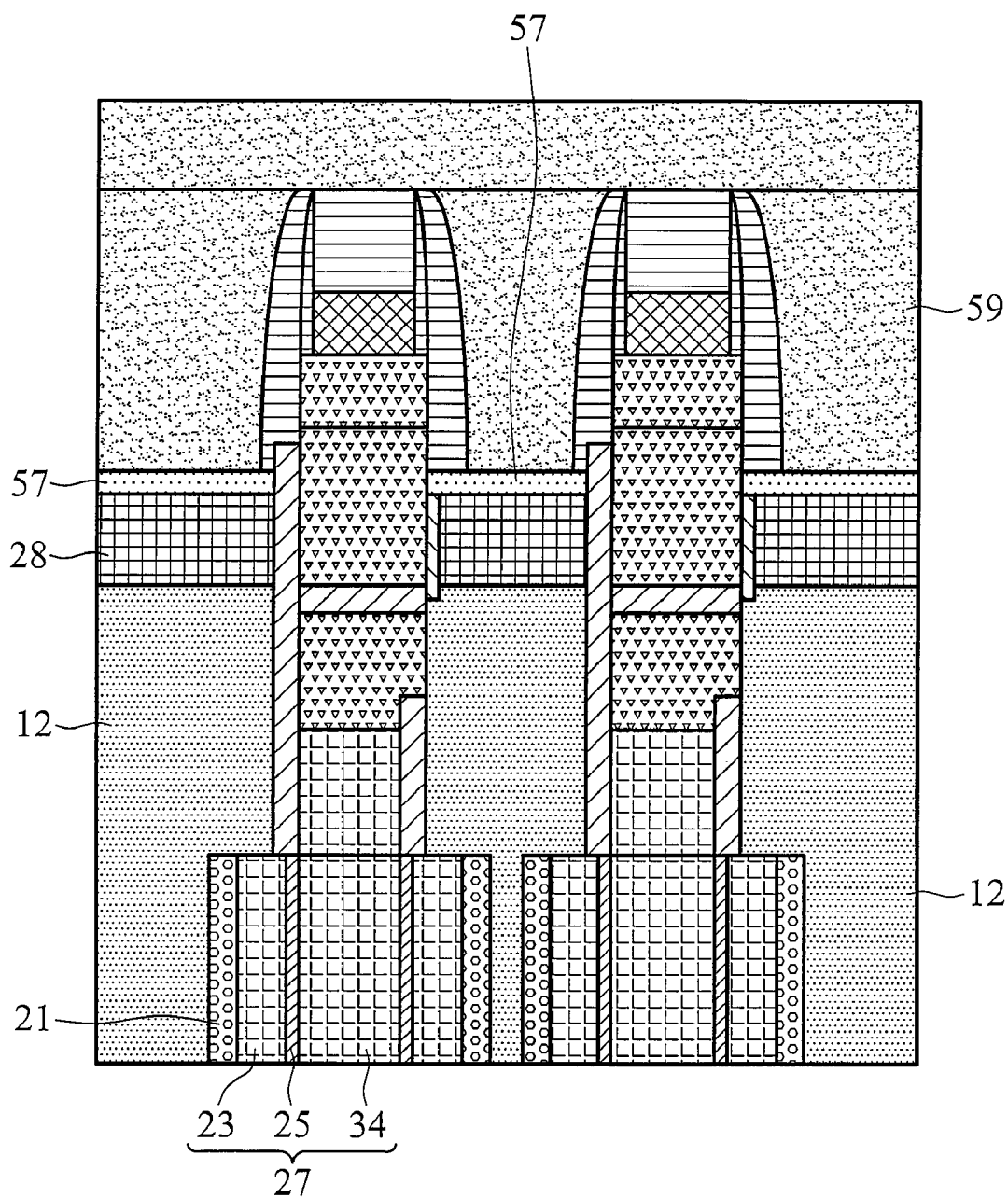

In another embodiment, a method for fabricating a memory device is disclosed in FIGS. 3A-3N. Referring to FIG. 3A, a substrate 12, for example, a silicon substrate, is provided. Next, a patterned pad layer 13 is formed on the substrate 12, exposing a region wherein a trench is subsequently formed. The pad layer 13 may comprise a pad oxide layer 15 and a pad nitride layer 17. An etching process is then performed to transfer the patterns of the pad layer 13 into the substrate 12 to form a trench 14 having an upper portion and a lower portion. Next, a mask layer 19, for example, a high-k material layer, is formed on a sidewall of the trench 14. For example, an aluminum oxide layer is conformally formed by a process such as atomic layer deposition (ALD) and then the lower portion uncovered with the mask layer 19 of the trench 14 is enlarged by, for example, a wet etching process, to form a bottle trench 14'.

An ion-implant process is then performed to dope ions into the substrate 12 using the mask layer 19 as a mask to form a doping area, for example, the $N^+$ or $P^+$ doping area serving as a buried electrode 21 as shown in FIG. 3B. Next, a metal-insulator-silicon (MIS) capacitor is fabricated. First, a bottom electrode 23 is formed in the lower portion of the trench 14. After removal of the mask layer 19, a capacitor dielectric layer 25, for example, a nitride layer or other dielectric material layers with a dielectric constant exceeding 7, is formed on the bottom electrode 23 of the trench 14. A conductive layer (not shown), for example, a polysilicon-doped conductive layer, is then deposited on the pad layer 13 and filled in the trench 14. After removal of a portion of the conductive layer and the capacitor dielectric layer 25 so as to an upper electrode 34 is formed in lower portion of the trench 14. Thus, completing the preparation of an MIS trench capacitor 27.

Next, an oxide layer is formed by, for example, a low pressure chemical vapor deposition (LPCVD) process and a dry etching process, to surround the sidewall of the trench 14 above the trench capacitor 27, serving as a collar dielectric layer 18 and expose the upper electrode 34. A conductive pillar, for example, a polysilicon-doped conductive pillar 20, is then formed in the trench 14 by processes such as chemical vapor deposition (CVD) and dry etching to electrically connect to the upper electrode 34 of the trench capacitor 27. Next, a conductive layer 24, for example, a polysilicon-doped conductive layer, is deposited on the pad layer 13 and filled in the trench 14. The conductive layer 24 is then planarized and etched by a chemical mechanical polish (CMP) process and an etch back process to leave a specific distance from the conductive layer 24 to the surface of the substrate 12.

Next, referring to FIG. 3C, a conductive layer 29, for example, a polysilicon-doped conductive layer, is conformally deposited on the surface of the pad layer 13, the collar dielectric layer 18 and the conductive layer 24. A tilt implant 31, for example, a $BF_2$ tilt implant process, is then performed. The implant angle is less than about 30°. Next, the conductive layer 29 undoped by the $BF_2$ and the exposed collar dielectric layer 18 are removed by a process such as wet etching to form a gap 33 between the conductive layer 24 and the substrate 12, as shown in FIG. 3D.

The substrate surface within the gap 33 is then nitrified to form a buried strap 22. Next, the conductive layer 24 is still filled in the gap 33 by a process such as CVD to electrically connect the buried strap 22 and the conductive pillar 20, as shown in FIG. 3E. In subsequent processes, dopants are diffused from the polysilicon-doped conductive layer 24 into the substrate 12 adjacent the gap 33 during a high-temperature process, to form a doping area in the substrate 12 adjacent the gap 33, serving as a source/drain. A top surface of the conductive layer 24 is then oxidized to form a top dielectric layer 26 in upper portion of the trench 14. The top dielectric layer 26 is approximately coplanar with the surface of the substrate 12.

Next, referring to FIG. 3F, a conductive layer 35, for example, a polysilicon-doped conductive layer, is filled in the trench and cover an surface of the pad layer 13. Next, the conductive layer 35 is planarized such that the surface of the pad layer 13 is exposed by a process such as CMP. A top of the conductive layer 35 is then oxidized to form a trench top oxide layer 37. Next, a nitride layer 39 and an oxide layer (not shown) are deposited on the pad layer 13 and the oxide layer 37. An active area is then defined by processes such as a lithography process and an etching process.

Next, the pad layer 13 is removed to expose a surface of the substrate 12, as shown in FIG. 3G. The upper portion of the trench 14 protrudes from the substrate surface. A nitride layer 41 is then conformally deposited on the substrate 12 and the upper portion surface of the trench 14.

Next, the nitride layer 41 on the substrate 12 is removed by a process such as a dry etching process, leaving a portion of the nitride layer 41 on both sidewalls of the protruded upper portion of the trench 14. An epitaxy layer 28 is then grown on the substrate 12 to a specific height lower than the trench top oxide layer 37, as shown in FIG. 3H. The epitaxy layer 28 has a growth rate of 10-20 Å/min. Next, an oxide layer 43 is conformally formed on the epitaxy layer 28 by, for example, a CVD process or a thermal oxidation process.

A nitride layer 45 is then conformally formed on the oxide layer 43, as shown in FIG. 3I. Next, an oxide layer 47 is deposited on the nitride layer 45. After the CMP process, a portion of the nitride layer 45' is exposed.

Next, the nitride layer 45', the oxide layer 43, the trench top oxide layer 37 and the conductive layer 35 are etched to expose the collar dielectric layer 18, the top dielectric layer 26 and the nitride layer 41, as shown in FIG. 3J. After removal of the exposed nitride layer 41, an oxide layer 30 is formed on a sidewall of the epitaxy layer 28 by a process such as a thermal oxidation process, serving as a gate oxide layer.

Next, a conductive layer 32 is deposited on the entire structure disclosed in FIG. 3J and filled in the trench 14. After the CMP process for planarized the conductive layer 32, a conductive layer 49, for example, tungsten/tungsten nitride layer, and a nitride layer 51 are deposited on the conductive layer 32. The conductive layer 32 has a thickness of 300-3,000 Å.

Next, a patterned resist layer (not shown) is formed on the nitride layer 51. The nitride layer 51 and the conductive layer 49 uncovered with the resist layer are etched by using the patterned resist layer as a mask, as shown in FIG. 3L. Next, a nitride layer is formed on a sidewall of the nitride layer 51, the conductive layer 49 and the conductive layer 32 by processes such as an LPCVD process and a dry-etched process to form a spacer 53 thereon. The conductive layer 32, the oxide layer 47, the nitride layer 45 and the oxide layer 43 are then etched by using the spacer 53 and the nitride layer 51 as a mask until the epitaxy layer 28 is exposed.

Next, referring to FIG. 3M, a top of the epitaxy layer 28 is doped to form a doping area for serving as source/drain 57. In an embodiment, a silicide (not shown), for example, a titanium-containing or nickel-containing silicide, may be formed on the source/drain 57. A nitride layer (not shown) is then deposited on the nitride layer 51, the spacer 53, the conductive layer 32 and the epitaxy layer 28 and dry-etched to form a spacer 55, as shown in FIG. 3M. Thus, completing preparation of a gate structure. The gate oxide layer 30 is disposed between the gate 32 and the epitaxy layer 28. The epitaxy layer 28 is disposed on both sides of the gate 32 on the substrate 12.

Finally, referring to FIG. 3N, an oxide layer 59 is deposited on the entire structure disclosed in FIG. 3M. A conductive plug (not shown) is then formed in the oxide layer 59 to electrically connect to the source/drain 57.

The trench top oxide (TTO) (the top dielectric layer) is formed on the top of the trench, adjacent to the substrate surface. Compared to conventional TTO fabrication, the invention is simple due to the lower trench aspect ratio formation. Moreover, the usable surface area of the trench is enlarged due to displacement of the trench top oxide (TTO), improving storage efficiency of the capacitor.

In the invention, a channel of a vertical transistor is formed by growth of the epitaxy layer on the substrate. Compared to a conventional process whereby the channel is fabricated in a silicon substrate, a channel length is precisely controlled by adjustment of the growth rate and the processing time of the epitaxy layer in the invention. For example, the channel length can be precisely controlled to achieve a dimension lower than 100 nm.

Figure 4:
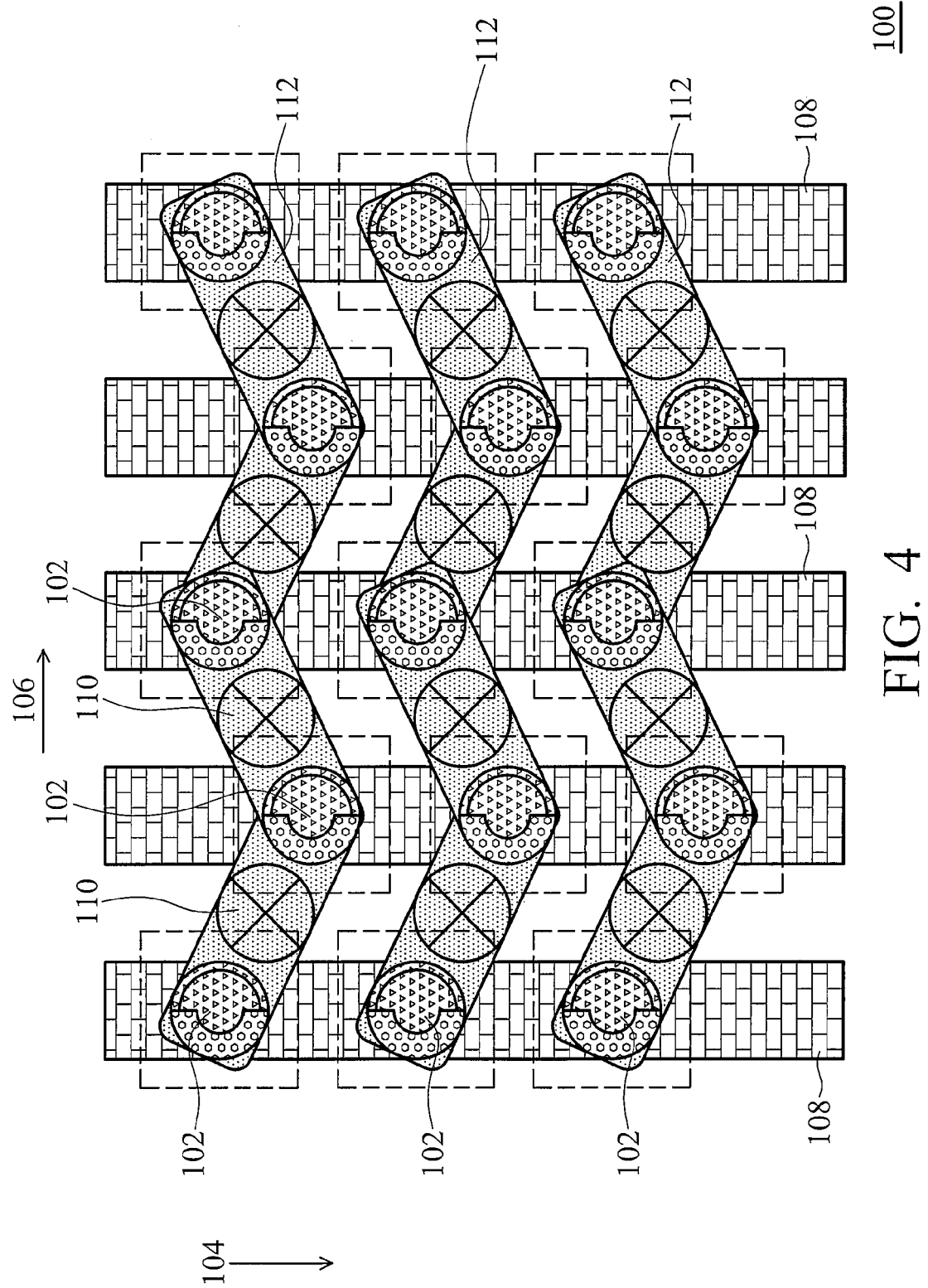
FIG. 4 is a top view of a memory device array in an embodiment of the invention.

In another embodiment, a memory device array is disclosed in FIG. 4A memory device array 100 comprises a plurality of memory devices 102. The memory devices 102 are extending disposed along a first direction 104 and a second direction 106. A plurality of word lines 108 overlies and electrically connects to the memory devices 102 disposed along the first direction 104. A plurality of conductive plugs 110 are formed between the memory devices 102 disposed along the second direction 106. A plurality of bit lines 112 overlies and electrically connects to the memory devices 102 disposed along the second direction 106, the conductive plugs 110 and the word lines 108 and exhibiting a zigzag arrangement.

In the invention, more memory devices are disposed within a unit area due to the zigzag array arrangement associated with the transistor miniature process.

While the invention has been described by way of example and in terms of preferred embodiment, it is to be understood that the invention is not limited thereto. To the contrary, it is intended to shelter various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a substrate;
   a trench having an upper portion and a lower portion formed in the substrate;
   a trench capacitor formed in the lower portion of the trench;
   a collar dielectric layer formed on a sidewall of the trench above the trench capacitor and extending away from a top surface of the substrate;
   a first doping area formed on a side of the upper portion of the trench in the substrate for serving as source/drain;
   a conductive layer formed in the trench and electrically connected to the first doping area;
   a top dielectric layer formed on the conductive layer;
   a gate formed on the top dielectric layer;
   an epitaxy layer formed on both sides of the gate and on the substrate;
   a second doping area formed on a top of the epitaxy layer for serving as source/drain; and
   a channel formed between the first doping area and the second doping area, wherein in the epitaxy layer, first doping area and second doping area are arranged such that a length of the channel is controlled by a thickness of the epitaxy layer.

2. The memory device as claimed in claim 1, wherein the first doping area is a buried strap.

3. The memory device as claimed in claim 1 further comprising a gate oxide layer formed between the gate and the epitaxy layer.

4. The memory device as claimed in claim 1, wherein the collar dielectric layer is formed between the epitaxy layer and the gate.

* * * * *